United States Patent
Tu

(10) Patent No.: US 7,262,090 B2
(45) Date of Patent: Aug. 28, 2007

(54) RANDOM ACCESS MEMORY (RAM) CAPACITOR IN SHALLOW TRENCH ISOLATION WITH IMPROVED ELECTRICAL ISOLATION TO OVERLYING GATE ELECTRODES

(75) Inventor: Kuo-Chi Tu, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 151 days.

(21) Appl. No.: 11/223,287

(22) Filed: Sep. 9, 2005

(65) Prior Publication Data

US 2006/0008976 A1 Jan. 12, 2006

Related U.S. Application Data

(62) Division of application No. 10/757,203, filed on Jan. 14, 2004, now Pat. No. 6,949,785.

(51) Int. Cl.
*H01L 21/8242* (2006.01)
*H01L 21/20* (2006.01)

(52) U.S. Cl. .................. 438/243; 438/248; 438/253; 438/386; 438/391; 257/E21.008

(58) Field of Classification Search ................ 438/199, 438/243, 244, 248, 253, 386, 391
See application file for complete search history.

(56) References Cited

U.S. PATENT DOCUMENTS

| | | | |
|---|---|---|---|
| 4,713,678 A | 12/1987 | Womack et al. ........... 357/23.6 |
| 5,793,076 A | 8/1998 | Fazan et al. ................ 257/298 |
| 6,256,248 B1 | 7/2001 | Leung ........................ 365/222 |
| 6,333,533 B1 | 12/2001 | Furukawa et al. .......... 257/301 |
| 6,420,226 B1 | 7/2002 | Chen et al. ................. 438/238 |
| 6,468,855 B2 | 10/2002 | Leung et al. ............... 438/239 |
| 6,580,110 B2 | 6/2003 | Schrems ..................... 257/301 |
| 6,613,690 B1 * | 9/2003 | Chang et al. ............... 438/712 |
| 6,638,813 B1 * | 10/2003 | Tzeng et al. ................ 438/244 |
| 6,661,050 B2 | 12/2003 | Tzeng et al. ................ 257/301 |
| 2004/0036051 A1 | 2/2004 | Sneh .......................... 251/301 |

OTHER PUBLICATIONS

"The Ideal SoC Memory: IT-SRAM" Leung et al., pp. 32-36, Proceedings of the IEEE 2000.

* cited by examiner

*Primary Examiner*—Michael Trinh
(74) *Attorney, Agent, or Firm*—Thomas, Kayden, Horstemeyer & Risley

(57) ABSTRACT

A process for fabricating a novel random access memory (RAM) capacitor in a shallow trench isolation (STI) The method utilizes a novel node photoresist mask for plasma etching recesses in the STI that prevents plasma-etch-induced defects in the substrate. This novel photoresist mask is used to etch bottle-shaped recesses in the STI under a first hard mask. After forming bottom electrodes in the recesses and forming an interelectrode dielectric layer, a conducting layer is deposited sufficiently thick to fill the recesses and to form a planar surface, and a second hard mask is deposited. The conducting layer is patterned to form the capacitor top electrodes. This reduced topography results in reduced leakage currents when the gate electrodes are formed over the capacitor top electrodes.

23 Claims, 7 Drawing Sheets

US 7,262,090 B2

RANDOM ACCESS MEMORY (RAM) CAPACITOR IN SHALLOW TRENCH ISOLATION WITH IMPROVED ELECTRICAL ISOLATION TO OVERLYING GATE ELECTRODES

CROSS-REFERENCE TO RELATED APPLICATION

This application is a divisional of U.S. patent application Ser. No. 10/757,203, filed Jan. 14, 2004, now U.S. Pat. No. 6,949,785.

BACKGROUND OF THE INVENTION (1) Field of the Invention

The present invention relates to a process for making storage capacitors for random access memory (RAM) devices, and more specifically for making improved RAM capacitors in recesses in shallow trench isolation (STI) with overlying gate electrodes for increased circuit density on 1T-SRAM cells. The 1T-SRAM cells are used in system-on-a-chip (SoC) technologies. The method of this invention utilizes a novel node photoresist mask for plasma etching recesses in the STI that prevents plasma-etch-induced defects in the substrate. This novel photoresist mask also provides bottle-shaped capacitor structures which maximizes capacitance while concurrently reducing the surface topography over the capacitor top electrodes. This reduced topography results in reduced leakage currents when the gate electrodes are formed over the capacitor top electrodes for increased circuit density.

(2) Description of the Prior Art

Static random access memory (SRAM) and Dynamic random access memory (DRAM) devices are widely used in integrated circuits in the electronics industry to store binary data. In these volatile memory devices the conventional SRAM utilizes six transistors to store each bit of binary data (1 or 0), while the DRAM uses a single charge stored on a capacitor, and one transfer transistor. The SRAM is fast but is of relatively low bit density, while the much smaller DRAM cell switches relatively slowly and requires frequent refresh cycles to maintain the charge on the capacitor. In recent years a new type of circuit design has been developed that uses a single transistor and single capacitor (commonly referred to a 1T-SRAM) to replace the more conventional six-transistor SRAM bit cell. The 1T-SRAM is described in more detail in the article titled "The Ideal SoC Memory: 1T-SRAM," W. Leung et al., pages 32-36 in Proceedings of the IEEE 2000, and the novel features are also described in U.S. Pat. Nos. 6,256,248 B1 and 6,468,855 B2 to Leung et al. In Leung's approach the bit lines are kept short and are made of metal, which reduces the ratio of the bit line to memory cell capacitance. This allows for smaller cell capacitors to be made in and on the substrate than is required for the more conventional DRAM. In addition, the array of small fast memory banks (multiBank) and the shorter word lines utilized in the 1T-SRAM device further reduce the cycle time.

One method of increasing memory cell density is to form word lines (gate electrodes) that extend over the RAM stacked capacitor in the STI recesses. However, there are several structure problems and processing problems which are described with respect to FIGS. 1 and 2. A schematic cross section showing a portion of a substrate 10 having a partially completed RAM capacitor in a recess is shown in FIG. 1. As shown in FIG. 1, after forming STI regions 12 in a substrate 10, a pad oxide 14, and a hard-mask layer are formed. Using a photoresist mask 18, openings 1 for bottom electrodes are plasma etched into the STI regions 12. Unfortunately, when the openings (not shown) in the photoresist mask extend over the edge of the substrate 10 (active device areas), the plasma etching, indicated by the vertical arrows 19 in FIG. 1, damages the substrate in the region X. This results in leakage currents that can degrade the RAM memory device.

A second problem associated with making these types of RAM capacitors is depicted in FIG. 2. After etching recesses 1 (see FIG. 1) in the STI 12, bottom electrodes 20 are formed. An interelectrode layer 22, top electrodes 24, and a second hard mask 26 (insulating layer) are formed to complete the capacitor. Unfortunately, during processing a crevice C is formed in the recesses, and when the word lines 32 are formed over the top electrodes 24, the second hard-mask layer 26 provides poor insulation between the word line and the top electrode resulting in electrical shorts S in the crevice C, as depicted in FIG. 2.

A method for making a deep trench capacitor is described in U.S. Pat. No. 4,713,678 to Womack et al. Womack does not address making word lines over the capacitor. Chen et al., U.S. Pat. No. 6,420,226 B1 describe a method for making a buried stacked capacitor structure in a shallow trench but do not address making word lines that extend over the capacitors. Schrems in U.S. Pat. No. 6,580,110 B2 describes making deep trench capacitors in a silicon substrate, but does not address forming stacked capacitors in a STI.

Therefore, there is still a strong need in the industry to make buried stacked capacitors in shallow trench recesses with improved structures having word lines extending over the capacitors for increased circuit density.

SUMMARY OF THE INVENTION

A principal object of the present invention is to form a novel RAM capacitor structure in a recessed shallow trench isolation with improved electrical characteristics for 1T-SRAM.

A second objective of this invention is to use a novel photoresist mask to etch openings through a ($Si_3N_4$) etch-stop layer in the shallow trench isolation without overlapping the active device areas. The photoresist mask is designed to extend over the shallow trench isolation region to protect the edge of the active device region from plasma-etch damage.

Another objective is to selectively remove portions of the STI under the ($Si_3N_4$) etch-stop layer to form a bottle-shaped cavity in which a capacitor bottom electrode and an interelectrode layer are formed.

A further objective is to form a top electrode sufficiently thick to fill the bottle-shaped cavity and to provide a more planar surface over the restriction at the top of the bottle-shaped cavity for forming more reliable overlying gate electrodes.

In accordance with the present invention a method for making novel recessed RAM stacked capacitor structures for 1T-SRAM-type devices with increased circuit density is described. More specifically, the method is described for making RAM capacitors in a shallow trench isolation (STI) on a substrate. The method begins by forming trenches in the substrate, filling the trenches with an insulating material to form the STI which surrounds and electrically isolates active device areas. The STI is formed planar with the top surface of the substrate. A pad oxide layer is formed on the substrate, and a first hard-mask layer is deposited on the pad oxide layer. A photoresist mask having openings is used to form recesses for capacitor bottom electrodes in the STI. A key feature is that the photoresist mask is designed to form the recesses to lie within the STI region to avoid plasma-etch damage to the active device areas. The recesses are then etched in the first hard-mask layer, in the pad oxide layer, and partially into the STI and leaving portions of the STI along edges of the active device areas to prevent plasma-etching damage to the active device areas. Anisotropic plasma etching is used during this process step. An isotropic wet etch ($EF/H_2O$) is used to remove the exposed portions of the STI on the active device areas and to recess the pad oxide under the first hard-mask layer, which extends over the STI regions. Because the recesses are etched in the first hard mask within the STI region, the isotropic etch results in recesses that are bottle-shaped. A conformal first conducting layer is deposited and removed back, for example, by polishing, to the first hard-mask layer to form capacitor bottom electrodes in the recesses. An interelectrode dielectric layer is formed over the bottom electrodes. A conformal second conducting layer is then deposited sufficiently thick to fill the bottle-shaped recesses. Because the recesses are bottle-shaped, the second conducting layer is essentially planar over the bottom electrodes. A blanket second hard-mask layer is then deposited on the second conducting layer, and the layers are patterned to form the top electrodes over the bottom electrodes in the recessed areas to complete the RAM capacitors. A conformal insulating layer is deposited and anisotropically etched back to form sidewall spacers on the sidewalls of the RAM capacitors. An FET gate oxide is then formed on the substrate. Next a third conducting layer, such as a doped polysilicon layer, is deposited and patterned to form gate electrodes (word lines) on the substrate and extending over the RAM capacitors. Since the capacitor top electrodes and the overlying second hard-mask layer are essentially planar, the gate electrodes are prevented from shorting to the underlying top electrodes, as occurs in the more conventional prior-art structure.

BRIEF DESCRIPTION OF THE DRAWINGS

The objects and advantages of this invention are best understood with reference to the attached drawings in the figures and the embodiment that follows.

DESCRIPTION OF THE PREFERRED EMBODIMENT

The method for making these RAM capacitors in a shallow trench isolation for 1T-SRAM applications is now described in detail. These capacitor structures are made with reduced plasma-etch damage to the substrate adjacent to the STI capacitor. Also, the capacitor is designed to have a bottle-shaped structure to maximize the capacitance while providing a top electrode that is essentially planar. The planar surface allows the word lines (gate electrodes) to extend over the capacitor for increased density while minimizing electrical shorts between the word lines and the underlying capacitor top electrodes. Although the capacitor structure is made for 1T-SRAM devices, it should be understood that this novel structure is also applicable to RAM structures in general.

Figure 3:
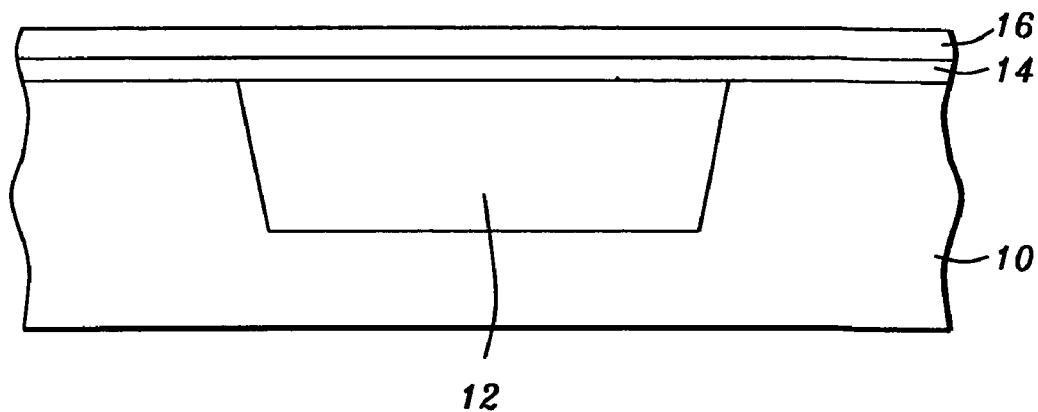
FIGS. 3-11 show schematic cross-sectional views of a single recessed stacked RAM capacitor using the sequence of process steps for making the improved structure by the method of this invention.

Referring first to FIG. 3, the method begins by providing a substrate 10, such as a P-doped single-crystal silicon. Shallow trenches are etched in the substrate 10 to a depth of between about 2500 and 5000 Angstroms. The trenches are filled with an insulating material to form the shallow trench isolation (STI) regions 12, which surround and electrically isolate active device areas. One typical method used to form the STI is to deposit a chemical-vapor deposited (CVD) silicon oxide and polishing back to the substrate to form an essentially planar surface, as shown in FIG. 3. Next a pad oxide layer 14, such as silicon oxide ($SiO_2$) is formed on the substrate. For example, the pad oxide can be formed using thermal oxidation or by depositing a CVD $SiO_2$. The pad oxide layer 14 is formed to a preferred thickness of between about 50 and 300 Angstroms.

Continuing with FIG. 3, a first hard-mask layer 16 is deposited on the pad oxide layer 14 to provide an etch-stop layer. The first hard-mask layer 16 is preferably silicon nitride ($Si_3N_4$) deposited, for example, by plasma-enhanced CVD or low-pressure CVD to a preferred thickness of between about 100 and 500 Angstroms.

Figure 4A:
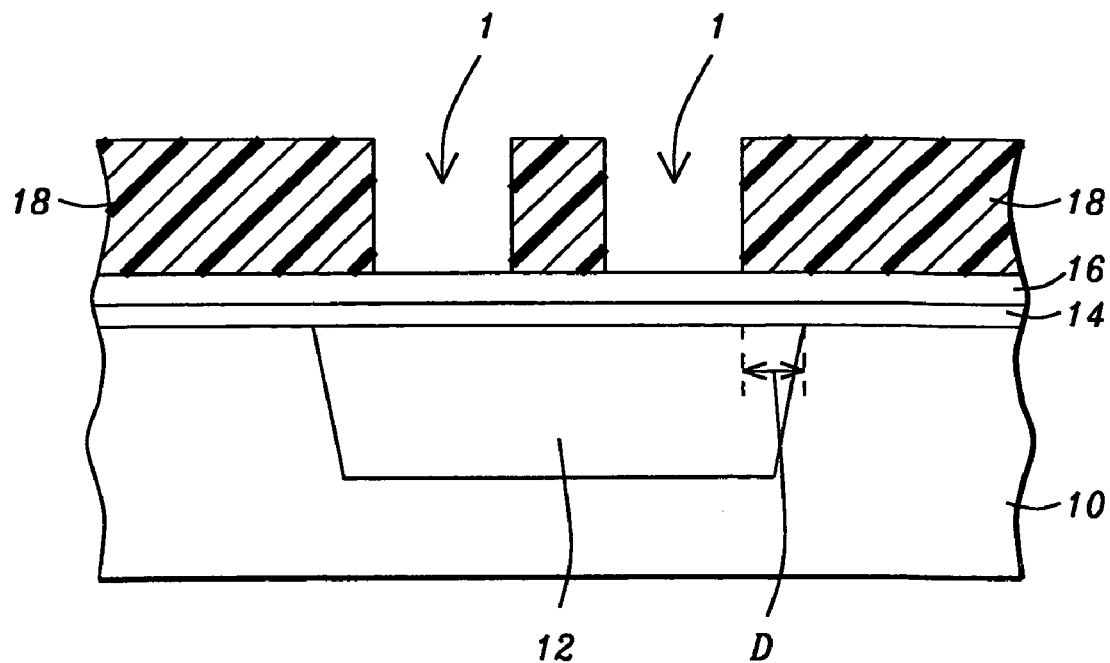
Figure 4B:
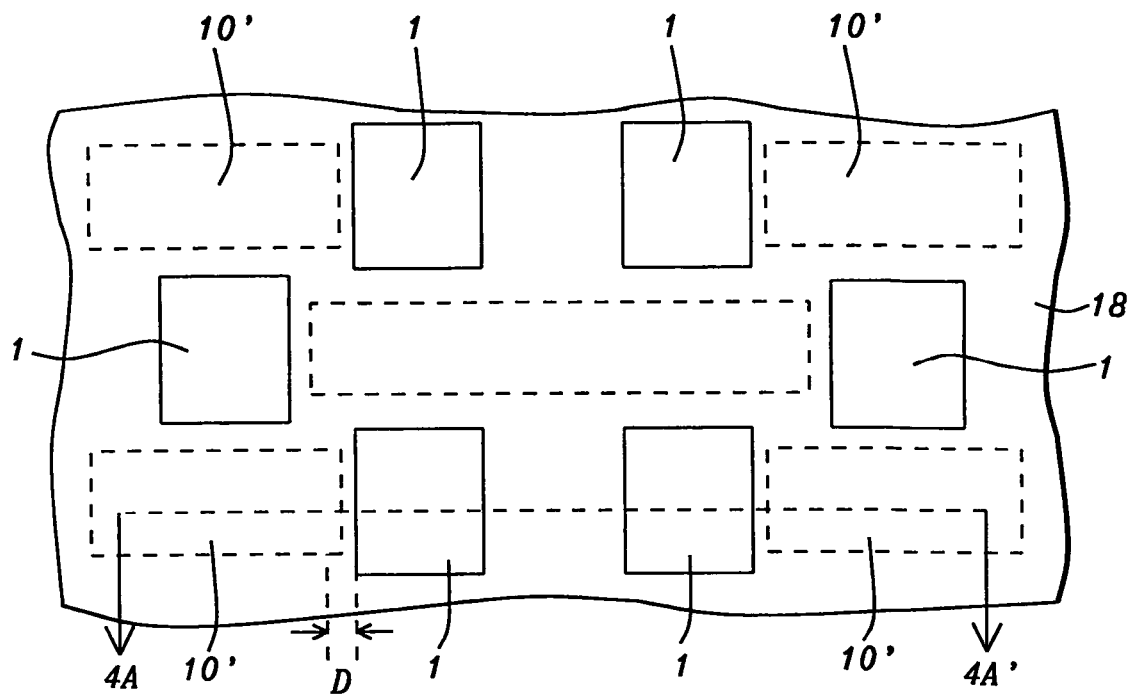

Referring to FIG. 4A, a photoresist mask 18 having openings 1 is used to form recesses for capacitor bottom electrodes in the STI 12. An important feature is that the photoresist mask is designed to protect the active device areas in the substrate 10. The photoresist mask 18 is designed to extend over the edge of the STI 12 by a distance D, so that the openings 1 lie totally within the STI region 12, as shown in FIG. 4A. When the bottom electrodes are later formed in the openings 1, the bottom electrodes will not overlap the active device areas. A top view of one design of the photoresist mask 18 is shown in FIG. 4B. The cross section of FIG. 4A is depicted in FIG. 4B by the line 4A-4A' and shows the openings 1 in the photoresist mask 18 do not overlap the underlying active device areas 10' on the substrate 10.

Figure 5:
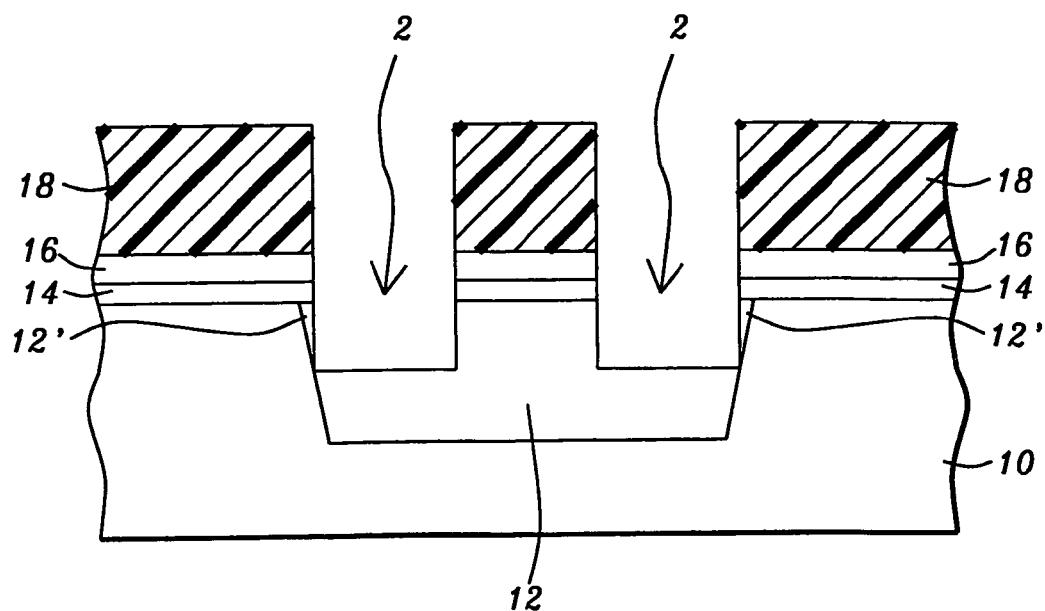

Referring to FIG. 5, using the photoresist mask 18, recesses 2 are etched in the first hard-mask layer 16, in the pad oxide layer 14, and partially into the STI 12 and leaving portions 12' of the STI along edges of the active device areas. The overlap D of the photoresist mask 18 (shown in FIG. 4) prevents plasma-etching damage to the active device areas, and therefore the bottom electrodes will be formed on a damage-free substrate area. The first hard mask 16, the pad oxide 14, and the STI 12 can be etched using, for example, high-density plasma etching and an etchant gas containing fluorine, such as $CHF_3$ The recesses 2 in the STI 12 are etched to a preferred depth of between about 1000 and 4000 Angstroms.

Figure 6:
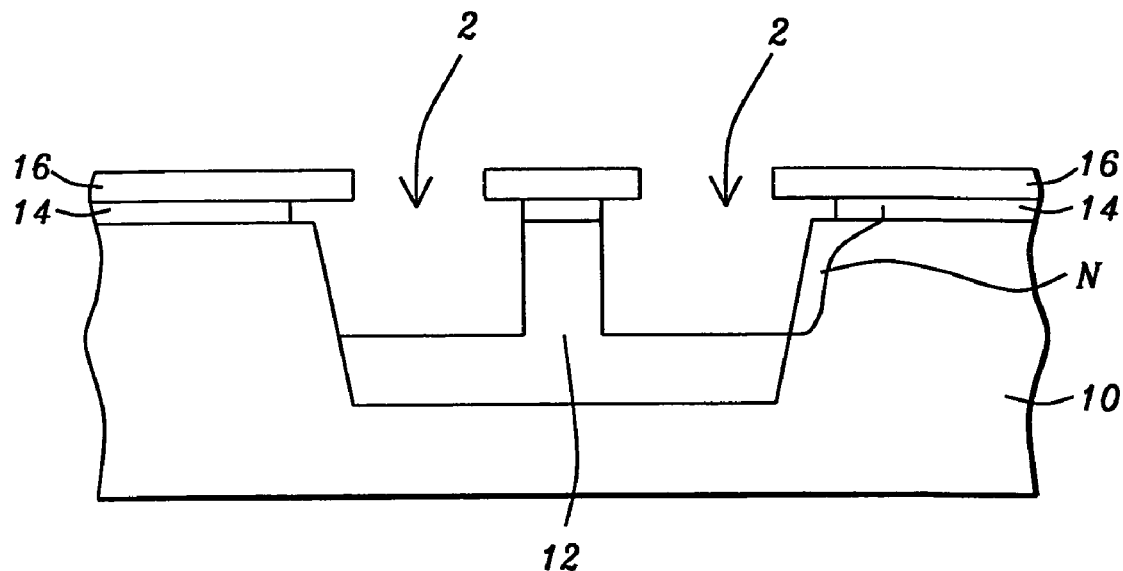

Referring FIG. 6, the photoresist mask 18 is removed, for example, by plasma ashing in oxygen. Next, an isotropic etch is used to remove the exposed portions 12' of the STI 12 on the active device areas and to recess the pad oxide 14 under the first hard-mask layer 16, which extends over the STI regions 12. The etching also exposes a portion N of the substrate 10 for forming capacitor node contacts. The isotropic etching can be carried out in a wet etch, for example, in a solution of hydrofluoric (HF) acid and water. Alternatively an HF vapor etch can be used for this isotropic etch step. This isotropic etch results in the recesses 2 having a bottle-shape under the first hard mask 16.

Figure 7:
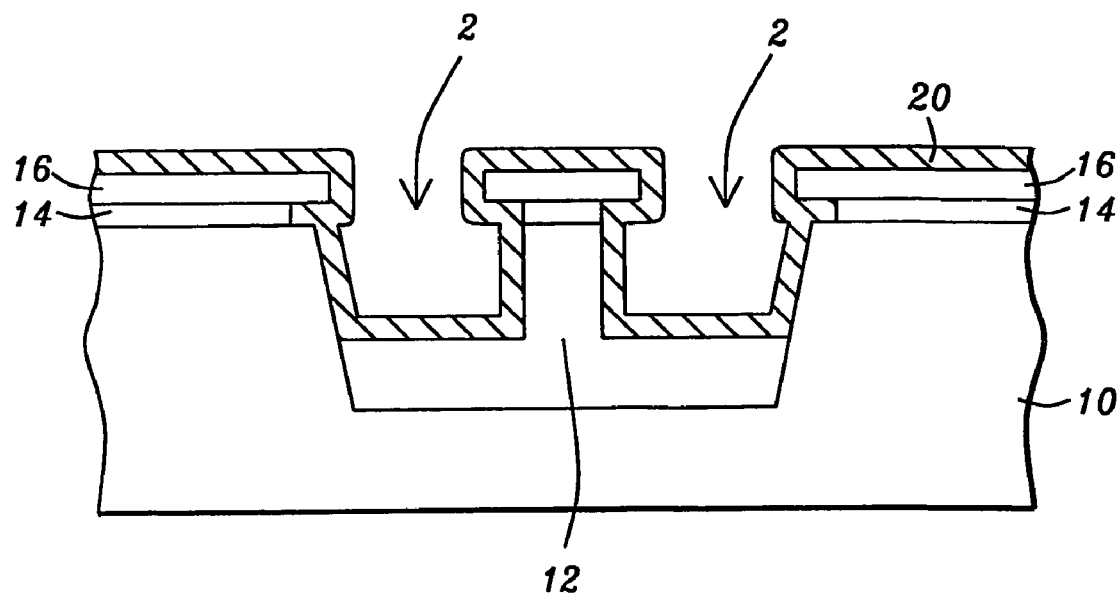

Referring to FIG. 7, a conformal first conducting layer 20 is deposited on the substrate and in the bottle-shaped recesses 2. Layer 20 is preferably polysilicon, and is doped with an N type dopant, such as arsenic or phosphorous for memory cells using N-channel FETs. Layer 20 is deposited by CVD to a thickness of between about 100 and 500 Angstroms, and is typically doped to a concentration of between about $2.0 \text{ E } 14$ and $1.0 \text{ E } 18$ atoms/cm$^3$. Alternatively, a P doped polysilicon or other conducting materials such as TiN, WN, MoN, WSiN, TiW, TaN, and Ta can also be used for the first conducting layer 20.

Figure 8:
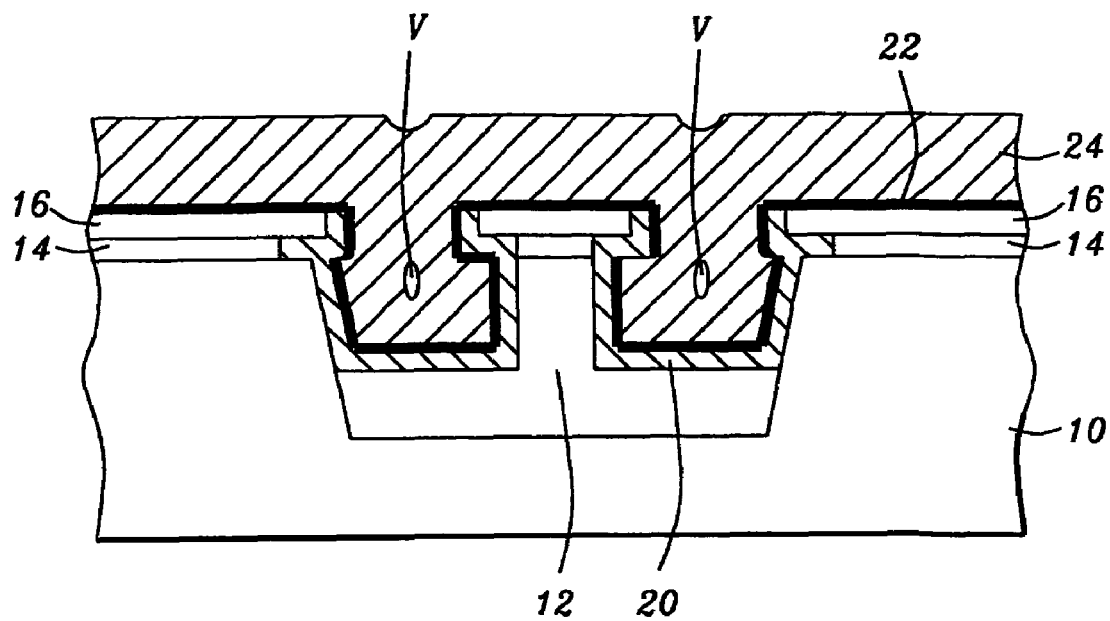

Referring to FIG. 8, the first conducting layer 20 is selectively removed to the first hard-mask layer 16. For example, layer 20 can be removed by polishing back to form capacitor bottom electrodes 20 in the recesses 2. Next, an interelectrode dielectric layer 22 is formed over the bottom electrodes. For example, a silicon oxide/silicon nitride/silicon oxide (ONO) can be formed by oxidizing the surface of layer 20, and forming a Si$_3$N$_4$ layer, which can then be reduced by thermal oxidation. The interelectrode dielectric layer 22 is formed to a preferred thickness of between about 30 and 100 Angstroms. Alternatively, layer 22 can be a high-dielectric insulator, such as HfO$_2$, Ta$_2$O$_5$, Al$_2$O$_3$, or ZrO$_2$.

Still referring to FIG. 8, a conformal second conducting layer 24, such as polysilicon, is deposited sufficiently thick to fill the bottle-shaped recesses 2, but in general would be deposited to a thickness of between about 200 and 800 Angstroms. Because the recesses are bottle-shaped, the second conducting layer 24 is formed essentially planar over the bottom electrodes 20. Although voids V may result in layer 24 within the bottle-shaped recesses 2, they do not adversely affect properties (electrical, physical, and the like) of the structure. The second conducting layer 24 is preferably an N doped polysilicon and can be deposited by CVD, and more specifically by LPCVD.

Figure 9:
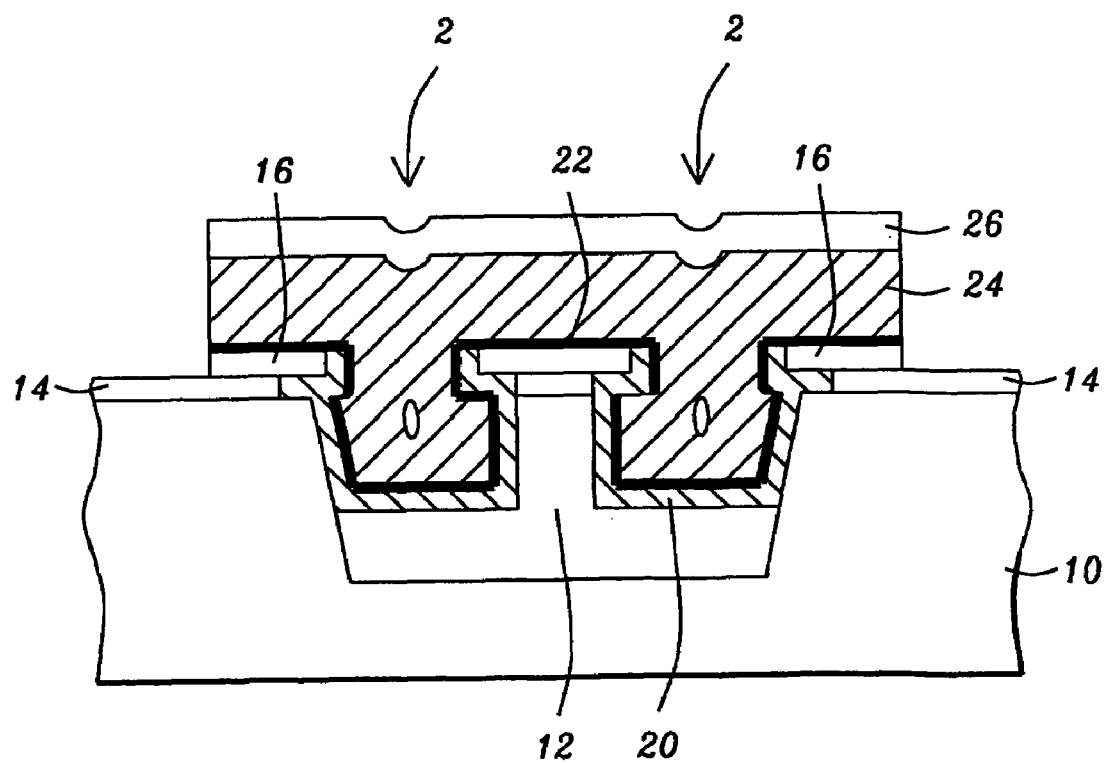

Referring to FIG. 9, a blanket second hard-mask layer 26 is deposited on the second conducting layer 24. The second hard mask is preferably silicon oxynitride deposited by PECVD to a thickness of between about 100 and 800 Angstroms. A photoresist mask (not shown) is then used to etch the second hard-mask layer 26, the second conducting layer 24, the interelectrode dielectric layer 22, and the first hard-mask layer 16 down to the pad oxide layer 14 to form top electrodes 24 over the bottom electrodes 20 in the recessed areas 2 to complete the RAM capacitors. The etching is carried out using anisotropic plasma etching and an appropriate sequence of etch gases.

Figure 10:
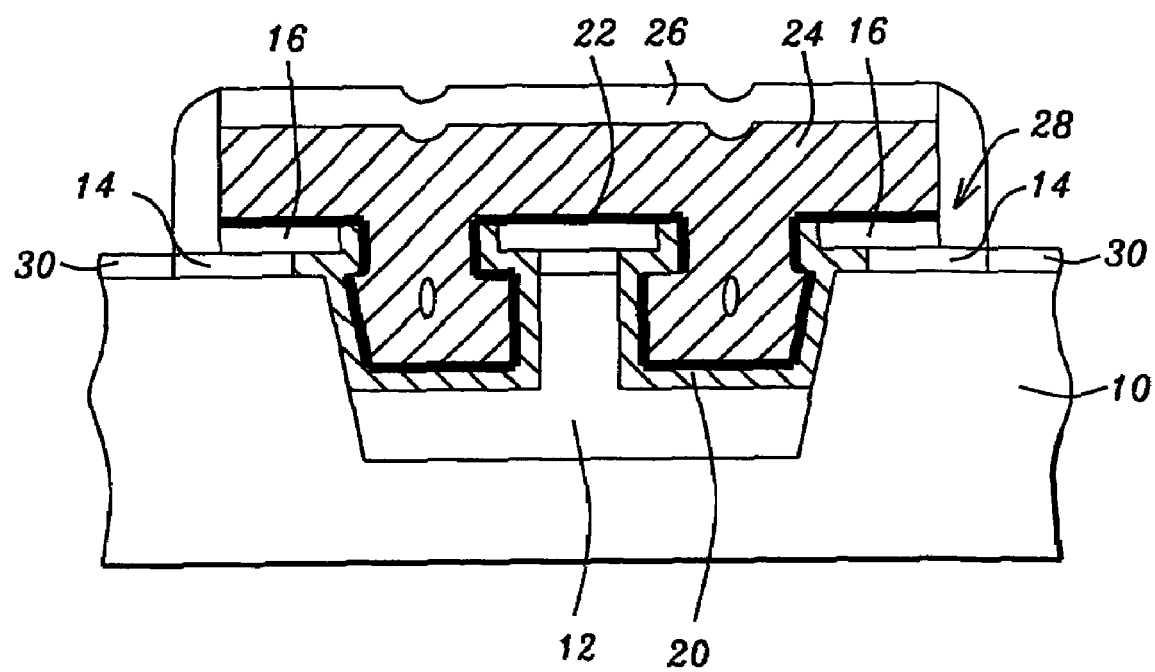

Referring now to FIG. 10, a conformal insulating layer is deposited and anisotropically etched back to form sidewall spacers 28 on the sidewalls of the RAM capacitors 24. The insulating layer is preferably a SiO$_2$ and may include a Si$_3$N$_4$ layer. Next, a gate oxide 30 is formed on the substrate 10 in the active device areas for FETs. One method of forming the gate oxide 30 is by thermal oxidation to a thickness of between about 10 and 150 Angstroms.

Figure 1:
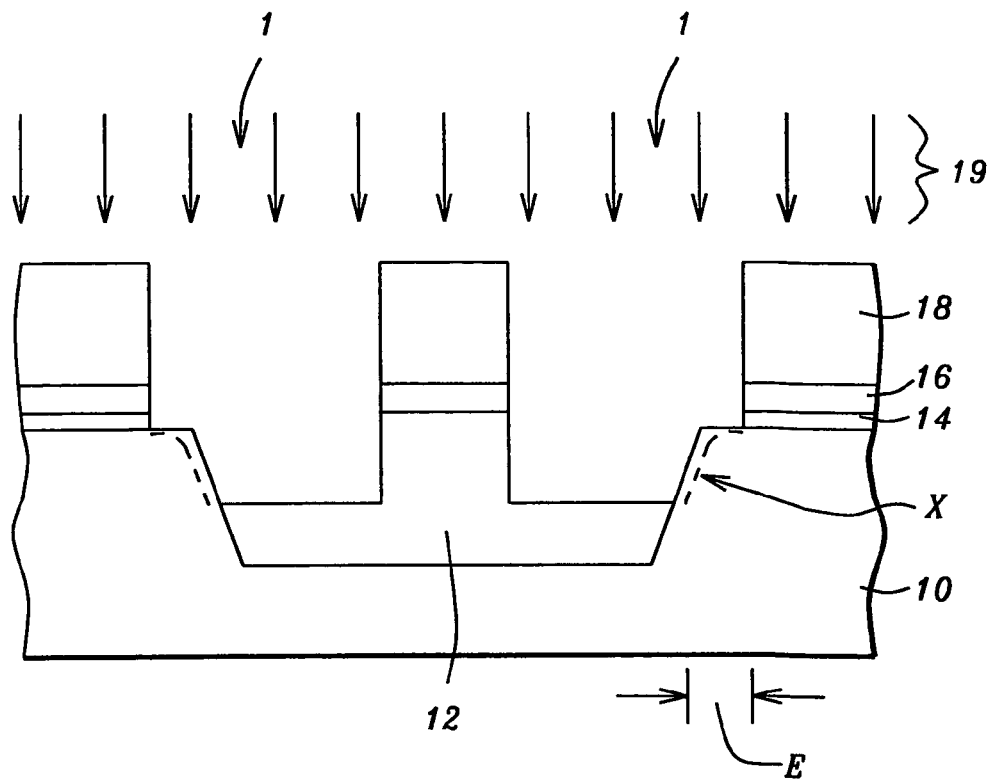
FIGS. 1 and 2 show schematic cross-sectional views of a portion of a substrate having a single RAM capacitor depicting the plasma-etch damage and the shorting problem associated with the prior art.

Referring to FIG. 1A, a third conducting layer 32 is deposited and patterned to form gate electrodes (word lines) 32 on the gate oxide 30 on the substrate and also extending over the RAM capacitors 24. The third conducting layer is patterned using conventional photolithographic techniques and anisotropic plasma etching. Layer 32 is preferably a doped polysilicon and may include a silicide (not shown) to improve conductivity. A salicide process can also be used to form the silicide on the gate electrodes while concurrently forming self-aligned contacts to source/drain areas of the FETs by including sidewall spacers on the FET gate electrodes (not shown in the drawings). Alternatively other conducting materials, such as metals, can be used for the third conducting layer 32. The third conducting layer 32 is deposited to a preferred thickness of between about 500 and 3000 Angstroms.

Figure 2:
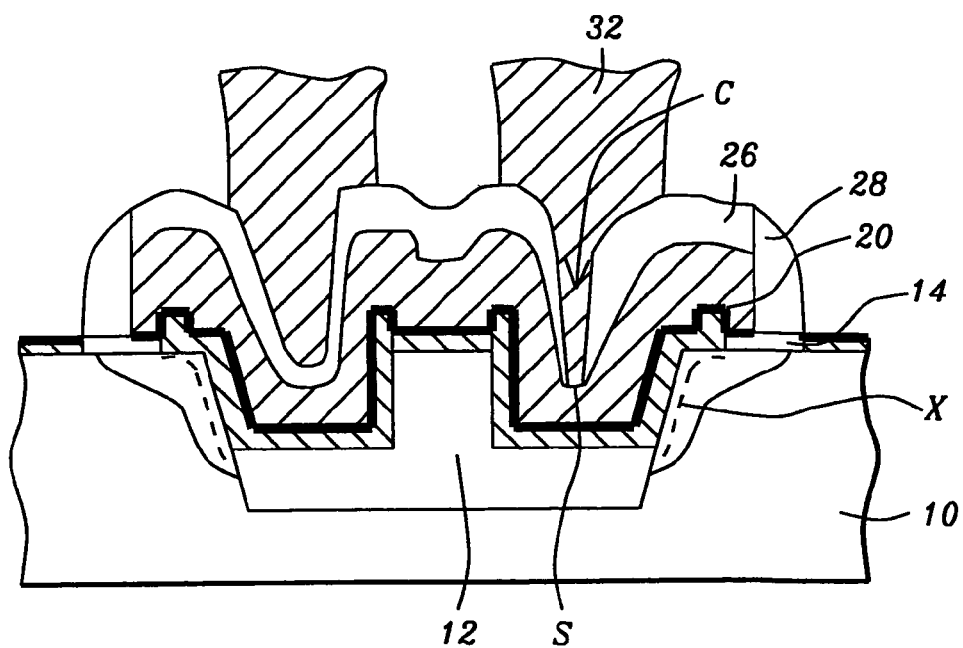
Figure 11A:
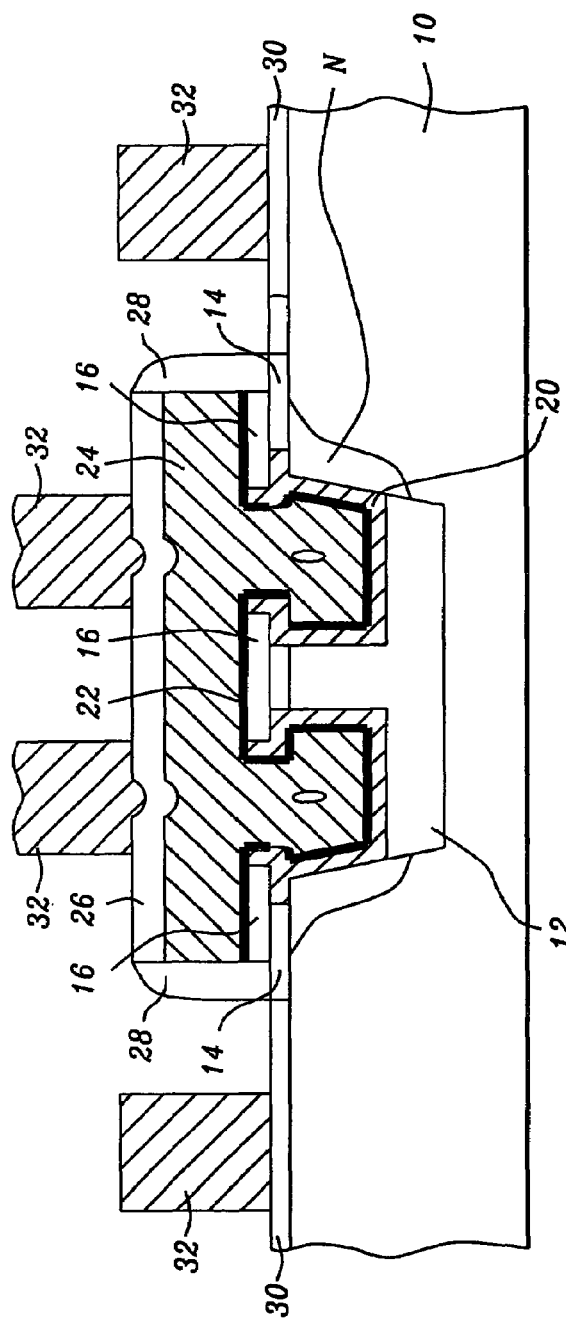

As shown in FIG. 11A, a key feature of this invention is that the capacitor top electrodes 24 and the overlying second hard-mask layer 26 are essentially planar, and therefore the gate electrodes (word lines) 32 are prevented from shorting to the underlying top electrodes, as occurs in the more conventional prior-art structure of FIG. 2.

Figure 11B:
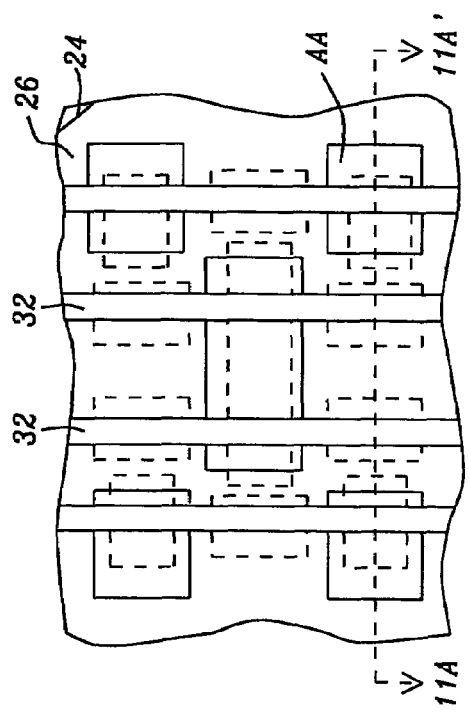

FIG. 11B is a top view of one possible layout showing the gate electrodes/word lines 32 extending over the active device areas AA and over the top electrode areas 24 on the substrate 10. The cross section in FIG. 11A is shown through the portion 11A-11A' in FIG. 11B.

While the invention has been particularly shown and described with reference to the preferred embodiment thereof, it will be understood by those skilled in the art that various changes in form and details may be made without departing from the spirit and scope of the invention.

What is claimed is:

1. A method for making random access memory (RAM) capacitors in a shallow trench isolation comprising the steps of:

providing a substrate having said shallow trench isolation surrounding active device areas;

forming a pad oxide layer on said substrate;

forming a first hard-mask layer on said pad oxide layer;

forming a photoresist mask having opening that lie over and within said shallow trench isolation areas;

anisotropically etching recesses in said first hard-mask layer, said pad oxide layer, and partially into said shallow trench isolation and leaving portions of said shallow trench isolation along edges of said active device areas thereby preventing plasma-etching damage to said active device areas during said etching;

isotropically etching exposed surfaces of said shallow trench isolation and removing said portions and recessing said pad oxide layer under said first hard-mask layer to expose said substrate for capacitor node contacts;

depositing a conformal first conducting layer and etching back to said first hard-mask layer to form capacitor bottom electrodes in said recesses;

forming an interelectrode dielectric layer over said bottom electrodes; and depositing a conformal second conducting layer to fill up said recesses.

2. The method of claim 1, further comprising:

forming a second hand-mask layer;

patterning said second hard-mask layer and said second conducting layer to form said RAM capacitors;

forming sidewall spacers on sidewalls of said RAM capacitors;

forming a gate oxide on said substrate;

depositing a third conducting layer and patterning to form gate electrodes on said substrate and over said RAM capacitors.

3. The method of claim 1, wherein said substrate is a silicon substrate.

4. The method of claim 1, wherein said pad oxide is formed on said substrate to a thickness of between about 50 and 300 Angstroms.

5. The method of claim 1, wherein said first hard-mask layer is silicon nitride and is deposited to a thickness of between about 100 and 500 Angstroms.

6. The method of claim 1, wherein said anisotropic etching is carried out in a high-density plasma etcher using an etchant gas mixture of $CHF_3$.

7. The method of claim 1, wherein said isotropic etching is carried out using $HF/H_2O$ solution.

8. The method of claim 1, wherein said first conducting layer is a material selected from the group that includes polysilicon, TiN, WN, MoN, WsiN, TiW, TaN, and Ta.

9. The method of claim 1, wherein said first conducting layer is deposited to a thickness of between about 200 and 800 Angstroms.

10. The method of claim 1, wherein said first conducting layer is etched back to said first hard-mask layer using chemical-mechanical polishing.

11. The method of claim 1, wherein said inter-electrode dielectric layer is silicon oxide/silicon nitride/silicon oxide and is formed to a thickness of between about 30 and 100 Angstroms.

12. The method of claim 1, wherein said second conducting layer is a material selected from the group that includes polysilicon, TiN, WN, MoN, WsiN, TiW, TaN, and Ta.

13. The method of claim 1, wherein said second conducting layer is deposited sufficiently thick to fill said recesses and to form a planar surface over said recesses.

14. The method of claim 2, wherein said second hard-mask layer is silicon oxynitride formed by plasma-enhanced chemical vapor deposition (PECVD) to a thickness of between about 100 and 800 Angstroms.

15. The method of claim 2, wherein said sidewall spacers are formed on said sidewalls of said RAM capacitors by depositing a conformal insulating layer and anisotropically etching back.

16. The method of claim 2, wherein said gate oxide is formed by thermal oxidation to a thickness of between about 10 and 150 Angstroms.

17. The method of claim 2, wherein said third conducting layer is a material selected from the group that includes polysilicon, TiN, WN, MoN, WsiN, TiW, TaN, and Ta.

18. The method of claim 2, wherein said third conducting layer is deposited to a thickness of between about 500 and 3000 Angstroms.

19. A method for making random access memory (RAM) capacitors in a shallow trench isolation, comprising:
   providing a substrate with said shallow trench isolation surrounding an active device area;
   forming a first hard-mask layer on said substrate;
   patterning said first hard-mask layer to have an opening that lies over and within said shallow trench isolation and does not overlap with said active device area;
   through said opening, etching a portion of said shallow trench isolation to form a recess in said shallow trench isolation, wherein said recess has a sidewall exposing a portion of said substrate;
   depositing a conformal first conducting layer over said recess;
   removing said first conducting layer on said first hard-mask layer to form a capacitor bottom electrode in said recess;
   forming an interelectrode dielectric layer over said capacitor bottom electrode; and
   depositing a conformal second conducting layer to fill up said recesses.

20. The method of claim 19, further comprising:
   before forming said first hard-mask layer on said substrate, forming a pad oxide layer on said substrate.

21. The method of claim 19, wherein the step of etching a portion of said shallow trench isolation comprises:
   through said opening, anisotropically etching said shallow trench isolation and leaving a portions of said shallow trench isolation along an edge of said active device area thereby preventing plasma-etching damage to said active device area; and
   through said opening, isotropically etching an exposed surface of said shallow trench isolation to form said sidewall of said recess.

22. The method of claim 20, wherein the step of isotropically etching said exposed surface is carried out in a wet etch.

23. The method of claim 19, wherein said recess has a depth shallower than said shallow trench isolation.

* * * * *